United States Patent [19]

Tonai

[11] Patent Number: 5,304,824
[45] Date of Patent: Apr. 19, 1994

[54] PHOTO-SENSING DEVICE

[75] Inventor: Ichiro Tonai, Osaka, Japan

[73] Assignee: Sumitomo Electric Industries, Ltd., Japan

[21] Appl. No.: 50,720

[22] Filed: Apr. 8, 1993

Related U.S. Application Data

[63] Continuation of Ser. No. 751,188, Aug. 29, 1991, abandoned.

[30] Foreign Application Priority Data

Aug. 31, 1990 [JP] Japan .................. 2-230206

[51] Int. Cl.$^5$ ........................................ H01L 31/10
[52] U.S. Cl. .................... 257/183; 257/189;
    257/200; 257/184; 257/442; 257/459; 257/459; 257/444
[58] Field of Search ............ 357/19, 52, 17, 30;
    257/183, 189, 200, 184, 442, 458, 459, 444

[56] References Cited

U.S. PATENT DOCUMENTS

| | | | |
|---|---|---|---|
| 4,819,039 | 4/1989 | Chi et al. | 357/19 |
| 4,949,144 | 8/1990 | Kuroda et al. | 357/52 |

FOREIGN PATENT DOCUMENTS

| | | |
|---|---|---|
| 354280 | 8/1988 | European Pat. Off. . |
| 57-173276 | 10/1982 | Japan . |
| 58-33881 | 2/1983 | Japan . |
| 60-171768 | 9/1985 | Japan . |
| 61-95580 | 5/1986 | Japan . |
| 61-289677 | 12/1986 | Japan . |
| 63-187671 | 8/1988 | Japan . |
| 1-28872 | 1/1989 | Japan . |
| 1-47081 | 2/1989 | Japan . |
| 1-262672 | 10/1989 | Japan . |
| 3832750 | 3/1990 | Japan . |

OTHER PUBLICATIONS

European Search Report and Annex.
Patent Abstracts of Japan, vol. 10, No. 24, Jan. 30, 1986 & JP-A-60 182778 (Fujitsu), Sep. 18, 1985.
C. S. Yin et al, "High Quantum Efficiency p+/pi/n−/n+ Silicon Photodiode", IEE Proceedings J. Optoelectronics, vol. 137, No. 3, Jun. 1990, Stevenage GB, pp. 171-173.
S. Kagawa et al, "Wide-wavelength InGaAs/InP PIN Photodiodes Sensitive from 0.7 to 1.6 mum", Japanese Journal of Applied Physics, vol. 28, No. 10, Oct. 1989, Tokyo JP pp. 1843-1846.

Primary Examiner—Eugene R. LaRoche
Assistant Examiner—Viet Q. Nguyen
Attorney, Agent, or Firm—Beveridge, DeGrandi, Weilacher & Young

[57] ABSTRACT

A low doped semiconductive layer is formed on a semiconductor substrate of a highly doped first conductivity type, and a first region of a highly doped second conductivity type is selectively formed at a portion of the semiconductive layer. In a top-incidence type photo-sensing device having a pn junction area of the above structure as a photo-sensing region, the first region is surrounded by a second region of the second conductivity type formed at a portion of the semiconductor layer. The second region has the same or a larger depth as that of the first region. Thus, even if light is directed to the outside of the photo-sensing region, extra charges generated therein are absorbed by the second region and the flow of extra charges into the photo-sensing region is prevented.

15 Claims, 10 Drawing Sheets

PHOTO-SENSING DEVICE

This application is a continuation of application No. 07/751,188, filed Aug. 29, 1991, abandoned which application is entirely incorporated herein by reference.

BACKGROUND OF THE INVENTION

1. Field of the Invention

The present invention relates to a photo-sensing device used for monitoring an output of a semiconductor laser or as a photo-sensor of a light communication system.

2. Related Background Art

Figure 1A:
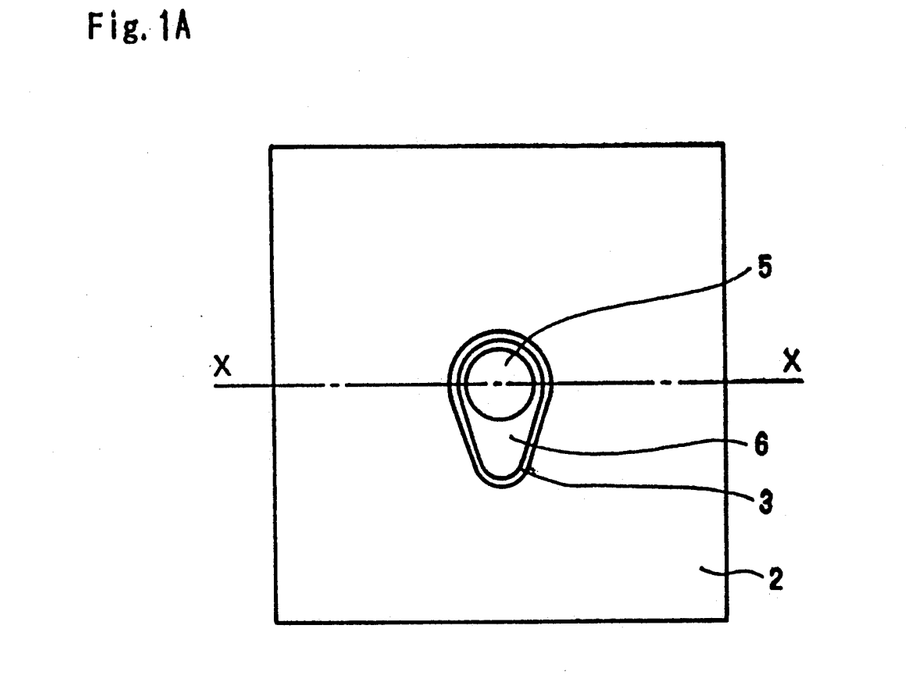
FIGS. 1A and 1B respectively show a structure of a prior art photo-sensing device.
Figure 1B:
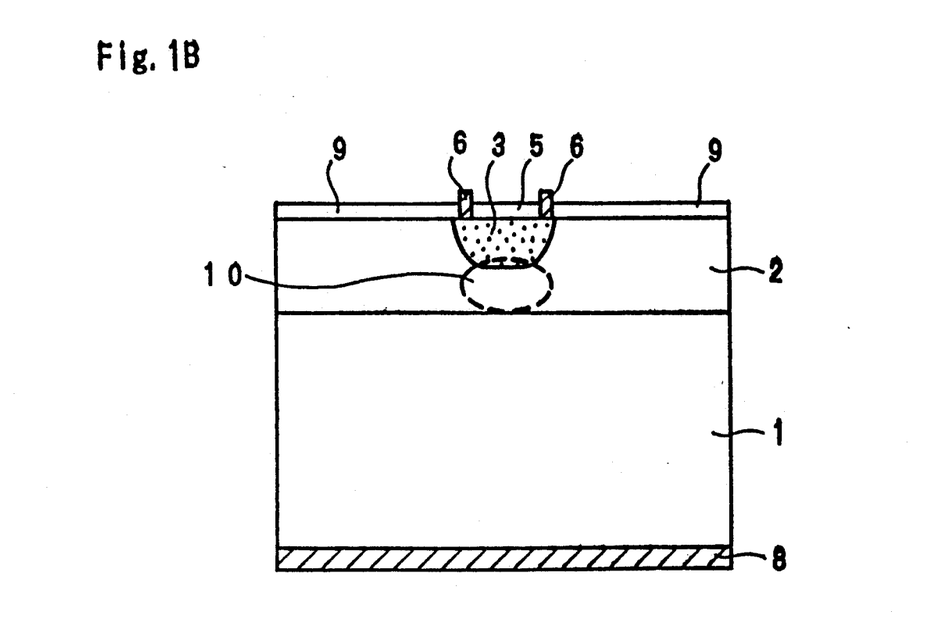

FIGS. 1A and 1B respectively show a top view and an X—X sectional view of a structure of a prior art photo-sensing device. As shown, in the prior art photo-sensing device, a semiconductive crystal layer 2 of a first conductivity type including a light absorption layer is laminated on a surface of a semiconductor substrate 1 of a first conductivity type having an electrode 8 of the first conductivity type formed on an underside there, and impurities are selectively diffused into the semiconductive crystal layer 2 to form a first region 3 of the second conductivity type. This is a pin photo-diode structure where the semiconductor substrate 1 is an n layer (or a p layer), the semiconductive crystal layer 2 is an i layer and the first region 3 is a p layer (or an n layer), and a photo-sensing region 10 is formed in the i layer. An electrode 6 of a second conductivity type is formed on the first region 3 on the surface of the semiconductor crystal layer 2, and the first region 3 inside the electrode 6 is covered with an anti-reflection film 5 while the semiconductive crystal layer 2 outside the electrode 6 is covered with a device protection film (i.e. passivation film) 9.

When a reverse bias is applied to the semiconductor device thus constructed, a depletion layer is created in a pn junction area in the semiconductive crystal layer 2. Thus, an electric field is developed in the depletion layer and electrons and holes generated by a light applied to the photo-sensing region 10 are directed to the first conductivity type semiconductor substrate 1 and the second conductivity type region 3, respectively, and accelerated thereby. In this manner, a photo-current is taken out and a light signal is detected.

Figure 2A:
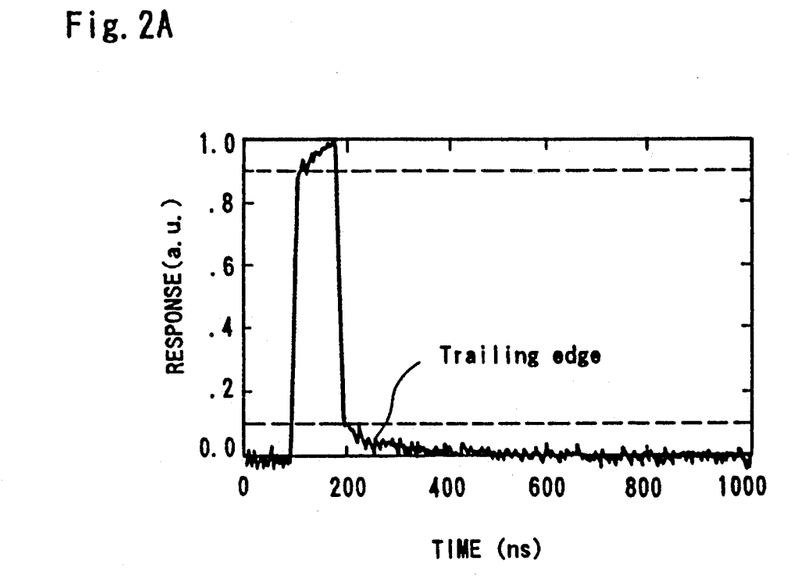
FIGS. 2A and 2B respectively show a light pulse response characteristic measured for a prior art structure and the structure of the present invention.

In the structure shown in FIGS. 1A and 1B, when the light is applied to the photo-sensing region 10, light generating carriers are captured by the depletion layer and a good response characteristic is offered. However, when the light is directed to the outside of the region 10, the generated carriers reach the pn junction while they are diffused by a density gradient and are taken out as a photo-current. As a result, the response characteristic is adversely affected. FIG. 2A shows a response characteristic of the photo-sensing device. Since the movement of the carriers by the diffusion is slow, a response waveform for a light pulse includes a tail at the end as shown in FIG. 2A.

When such a photo-sensing device is used for light communication, light emitted from an optical fiber is condensed so that it is directed to the photo-sensing region 10. However, when a portion of light leaks out of the photo-sensing region 10, it leads to the reduction of the response speed of the photo-sensing device by the reason described above. In a high speed photo-sensing device, the area of the photo-sensing region 10 is reduced to reduce a junction capacitance. As a result, a ratio of light directed to the outside of the photo-sensing region 10 increases and a diffused component which has a low response speed increases. This leads to the degradation of the response speed.

When the light emitted from a rear end plane of the semiconductor laser is sensed by the photo-sensing device to feedback-control a drive current for the semiconductor laser in order to keep the light output of the semiconductor laser at a constant level, if the light emitted from the semiconductor laser spreads to the outside of the photo-sensing region 10 of the photo-sensing device, a low response speed component is generated by the diffusion as described above. This adversely affects the feedback control.

SUMMARY OF THE INVENTION

It is an object of the present invention to provide a photo-sensing device which has an improved response speed.

A photo-sensing device of the present invention is a top-entry type photo-sensing device having a pn junction area, as a photo-sensing region, formed by selectively providing a first region of a second conductivity type in a portion of a semiconductive layer of a first conductivity type. The first region is surrounded by a second region of the second conductivity type formed in a portion of the semiconductive layer, and the second region has the same or deeper depth as or that of the first region.

Accordingly, even if light is directed to the outside of the photo-sensing region, the charges are absorbed by the second region and the flow of the charges into the photo-sensing region is prevented. Thus, only the required photo-current is taken out to an external circuit.

It is further object of the present invention to provide a top-entry type photo-sensing device having a pn junction area, as a photo-sensing region, formed by selectively providing a first region of a heavily doped second conductivity type into a portion of a lightly doped semiconductive layer formed on a semiconductor substrate of a heavily doped first conductivity type, characterized in that the first region is surrounded by a second region of the second conductivity type formed in a portion of said semiconductive layer.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENT

The embodiments of the present invention are now explained with reference to the drawings.

Figure 3A:
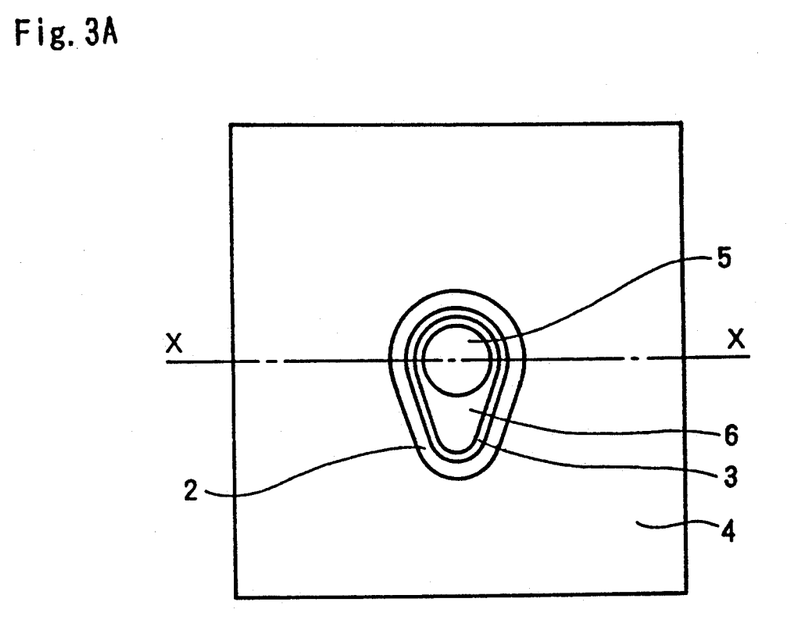
FIGS. 3A and 3B respectively show a basic structure of a photo-sensing device of the present invention.
Figure 3B:
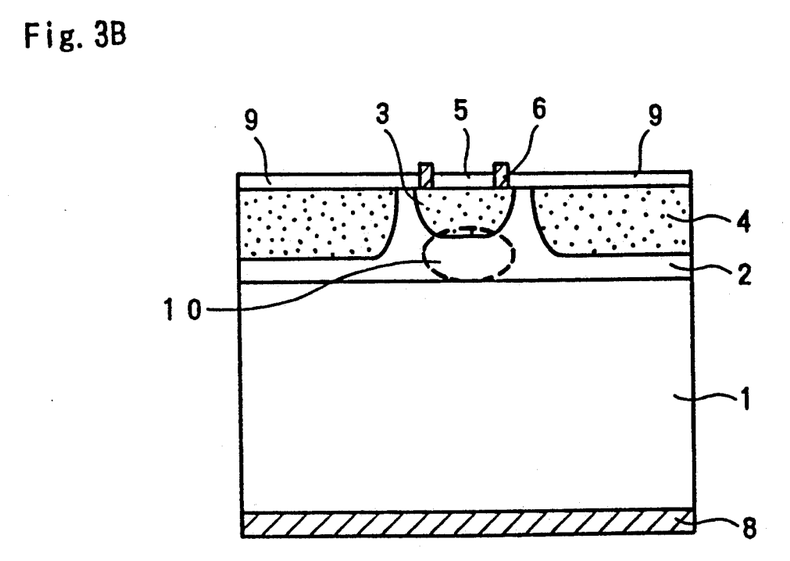

FIGS. 3A and 3B respectively show a basic structure of a photo-sensing device of the present invention. FIG. 3A show a top view and FIG. 3B shows an X—X sectional view. As shown a semiconductive crystal layer 2 of a lightly doped first conductivity type is formed on a surface of a semiconductor substrate 1 of a heavily doped first conductivity type having an n-electrode 8 formed on an underside thereof, and a first region 3 of a second conductivity type is formed in the semiconductive crystal layer 2 by impurity diffusion. A pn junction area formed by the provision of the first region 3 is used as a photo-sensing region 10. The first region 3 is surrounded by the second region 4 of the second conductivity type formed by the impurity diffusion. A p-electrode 6 is formed on the first region 3 on the surface of the semiconductive crystal layer 2, and an anti-reflection film 5 is formed on the first region 3 inside the electrode 6 while a film 9 is formed on the semiconductive crystal layer 2 outside the electrode 6.

In the structure such as the above embodiment in which the semiconductive crystal layer 2 is used as an i layer of a pin photo-diode, generally, the addition of the impurities is not performed in the crystal growth. But the semiconductive crystal layer may become the first conductive type semiconductor layer by a locally stoichiometric shift in some kind of material or by the mixture of the impurities from a crystal growing apparatus etc. Further, in order to improve the electrical characteristics of a device, the impurities may be added in formation of the semiconductor crystal layer 2. Therefore, in the present application, the meaning of "lightly doped" also includes the case that "the intentional addition of the impurities is not performed".

When a reverse bias is applied to the semiconductor device thus constructed, a depletion layer is created in the pn junction area in the semiconductive crystal layer 2. Thus, an electric field is developed in the depletion layer and electrons and holes generated by the light directed to the photo-sensing region 10 are directed to the first conductivity type semiconductor substrate 1 and the second conductivity type region 3, respectively, and accelerated thereby. In this manner, a photo-current is taken out and a light signal is detected. On the other hand, when the light is directed to the outside of the photo-sensing region 10, undesired carriers are absorbed by a depletion layer created by the second region 4 which is deeply formed in the semiconductive crystal layer 2. Accordingly, only the photo-current required for the detection of the light signal can be taken out. A structure for absorbing the undesired charges by an impurity layer is disclosed in Japanese Laid-Open Patent Application No. 96719/1978; it teaches the provision of the impurity layer in order to present interference between a photo-sensing device and a scan circuit in an image sensor. However, the improvement of the response speed which is the object of the present invention is not attained.

Figure 4A:
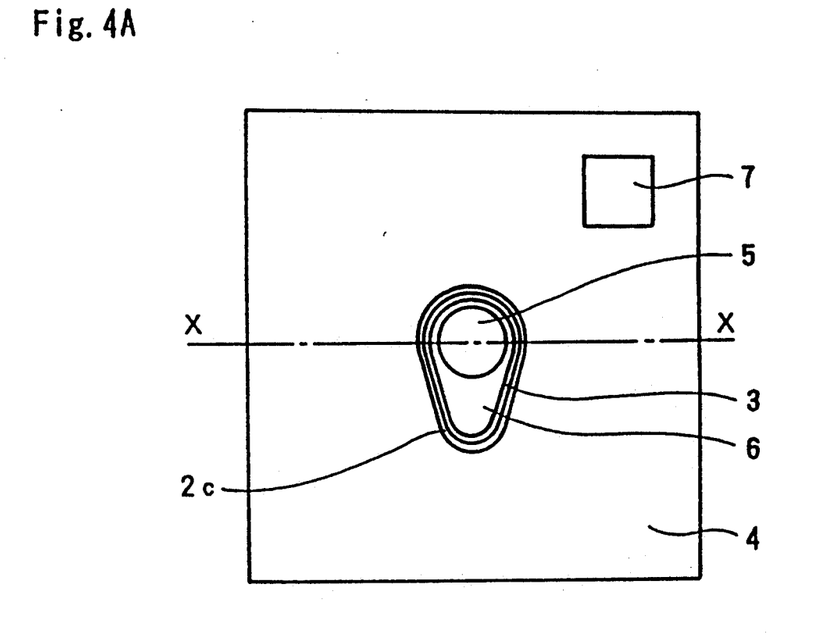
FIGS. 4A and 4B respectively show a structure of a photo-sensing device in accordance with a first embodiment of the present invention.
Figure 4B:
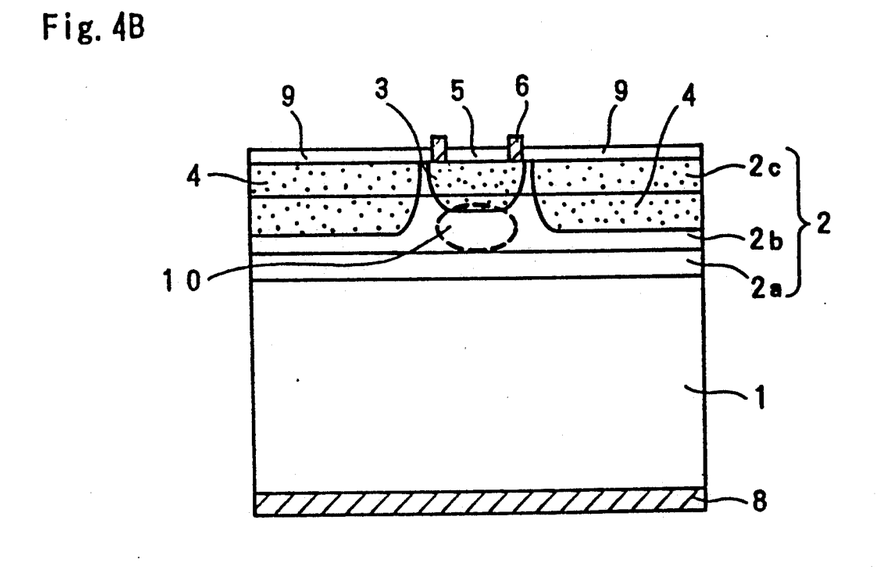

Specific embodiments based on the above basic structure are now explained. FIGS. 4A and 4B respectively show a structure of a first embodiment. FIG. 4A shows a top view and FIG. 4B shows an X—X sectional view. As shown, an n-type InP buffer layer 2a (dopant concentration $n=2\times10^{15}cm^{-3}$, thickness 2 $\mu m$), an n-type InGaAs (indium-gallium-arsenide) absorbing layer 2b ($n=2\times10^{15}cm^{-3}$, thickness 3.5 $\mu m$) and an n-type InP window layer 2c ($n=2\times10^{16}cm^{-3}$, thickness 2 $\mu m$) are formed on a surface of an n+-type Inp (indium-arsenide) semiconductor substrate 1 ($n=2\times10^{18}cm^{-3}$) having an n-electrode 8 formed on an underside thereof. A first region 3 and a second region 4 of a p type are formed on the photo-sensing layer 2b and the window layer 2c by selective diffusion of Zn (zinc) by a sealed ampoule method (impurity doping method using a sealed silica tube including a semiconductor wafer and an impurity material). A p-electrode 6 is formed on the first region 3 in the semiconductive crystal layer 2, and an anti-reflection film 5 is formed on the region 3 inside the electrode 6 and a passivation film 9 is formed outside the electrode 6. An electrode 7 for taking out the charges collected at the second region 4 is formed on the semiconductive crystal layer 2.

Figure 5:
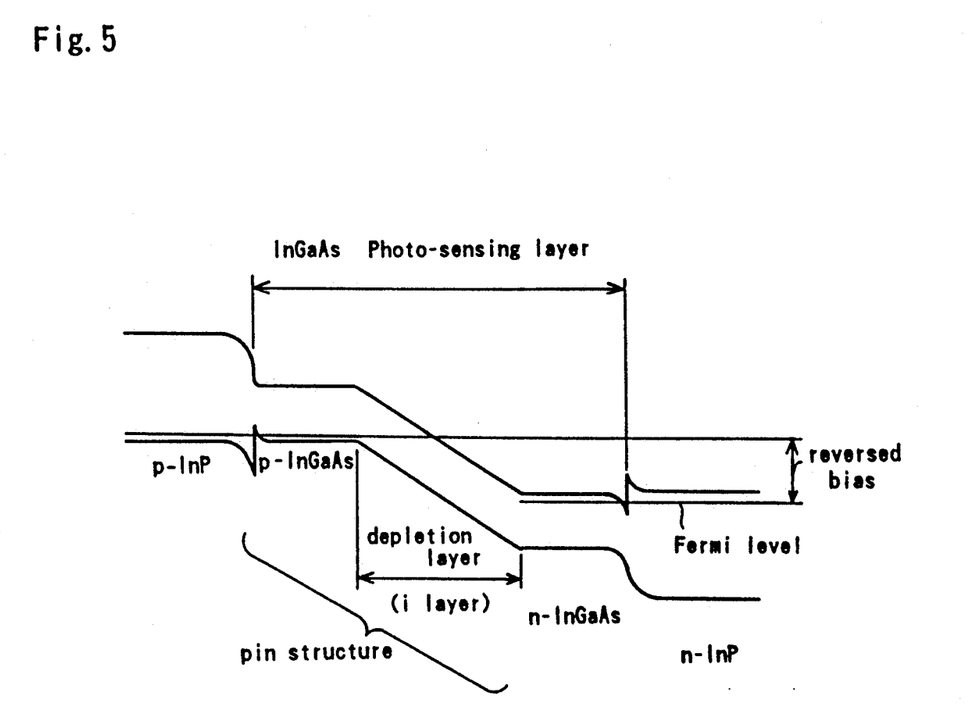
FIG. 5 shows a band gap energy chart of the photo-sensing device structure of the first embodiment.

A band gap energy chart of the pin structure is shown in FIG. 5. In the present embodiment, the composition of In Ga As of the absorbing layer 2b is $In_{0.53}Ga_{0.47}As$. This composition provides the smallest band gap energy, that is, can sense the longest wavelength light among the InGaAsP semiconductors which can be lattice-matched with the InP layer.

It is preferable that the thickness of the absorbing layer 2b is between 1 $\mu m$ and 7 $\mu m$ to attain efficient absorption of the incident light, although it is not limited thereto. It is further preferable that a width of the n type region between the first region 3 and the second region 4 is between 5 $\mu m$ and 30 $\mu m$ to attain a good response characteristic and electrical characteristic, although they are not limited thereto. In this embodiment, the diameter of the first region is 100 $\mu m$.

Figure 4C:
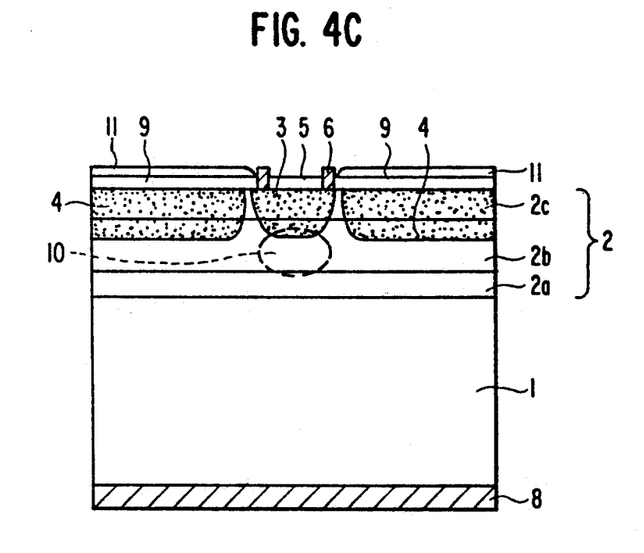
FIG. 4C shows an alternative form of the embodiment of FIGS. 4A and 4B.

When light having a wavelength of 1.3 $\mu m$ is applied to the photo-sensing device thus constructed, if the light is directed to the outside of the photo-sensing region 10, undesired charges are collected by the depletion layer created by the second region 4 deeply formed in the semiconductive crystal layer 2 as described above. When the depth of the second region 4 is deeper than that of the first region 3, a capturing effect for extra charges is higher, because the extra charges are generated in the absorbing layer outside the photo-sensing region and diffuse into the photo-sensing region by the density graduation. Accordingly, the second region 4 may be deep enough to reach the buffer layer 2a. However, it is not necessary that the second region 4 is so deep. For example, when the first region 3 and the second region 4 are simultaneously formed, they are of the same depth as shown in FIG. 4C. In this case, the same effect as that of the present embodiment can be attained. However, when the second region 4 is shallower than the first region 3, the above effect is not attained.

Figure 2B:
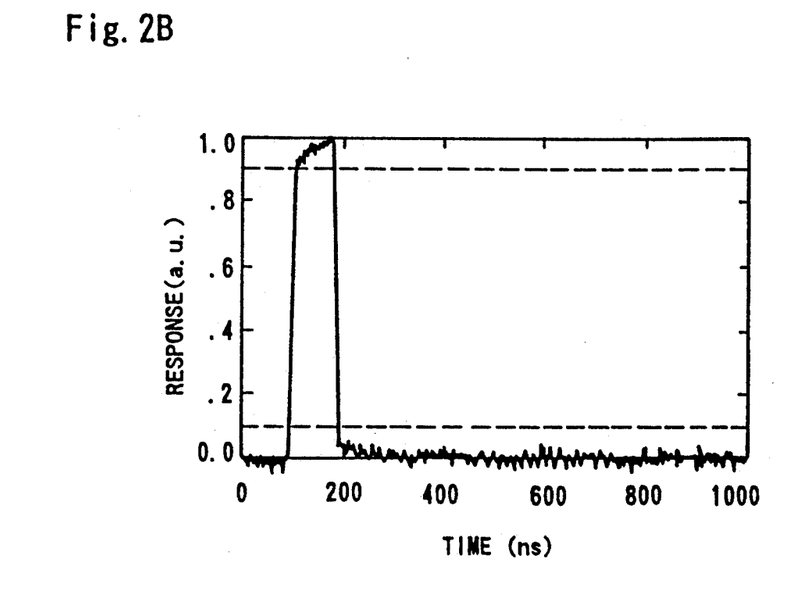

Only the photo-current necessary for the detection of the light signal can be taken out by the above structure. The response speed of the photo-sensing device was measured. As shown in FIG. 2B, that the end of the waveform includes no tail and no degradation of the response speed by stray light directed to the outside of the photo-sensing region 10 was confirmed.

In the present embodiment, the incident light has a wavelength of 1.3 $\mu$m. Since the photo-sensing layer 2b is the $In_{0.53}Ga_{0.47}As$ layer, the same effect is attained for an incident light of a long wavelength such as 1.55 $\mu$m.

Figure 6A:
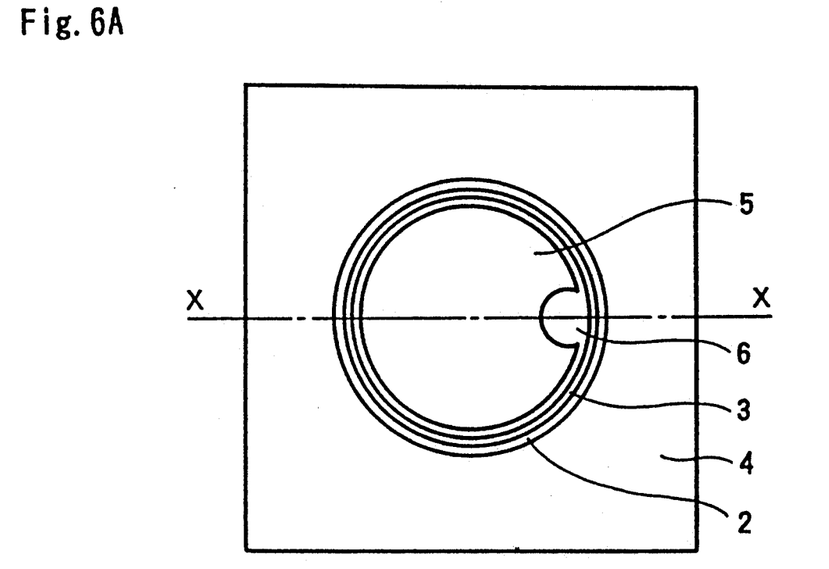
FIGS. 6A and 6B respectively show a structure of a photo-sensing device in accordance with a second embodiment of the present invention.
Figure 6B:
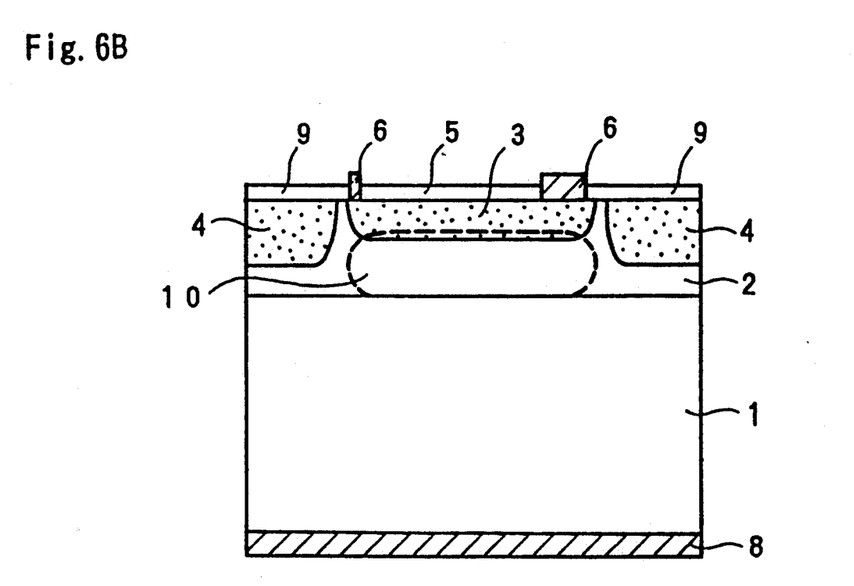
Figure 6C:
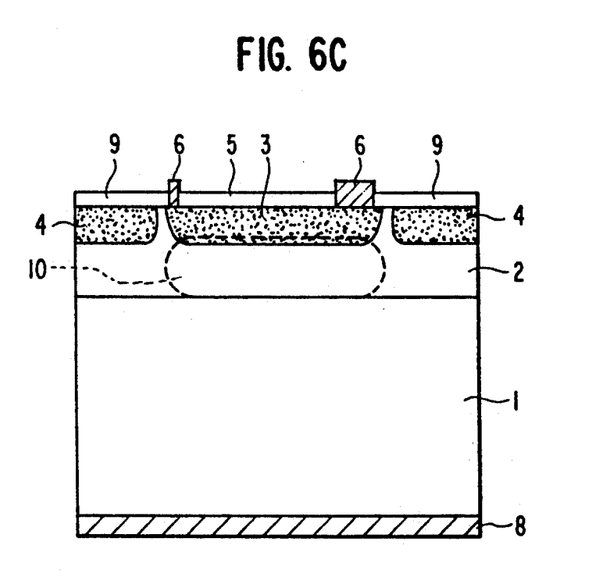
FIG. 6C shows an alternative form of the embodiment of FIGS. 6A and 6B.

A second embodiment is now explained with reference to FIGS. 6A and 6B. FIG. 6A shows a top view and FIG. 6B shows an X—X sectional view. In the present embodiment, an n-type $In_{0.53}Ga_{0.47}As$ absorbing layer (n=$1\times 10^{15}$cm$^{-3}$ thickness 5 $\mu$m) is formed, as a semiconductive crystal layer 2, on a surface of an n$^+$-type InP substrate 1 having an n- electrode 8 formed on an underside thereof, and a first region 3 and a second region 4 of p type are formed by the selective diffusion of Zn. A diameter of the first region 3 is 300 $\mu$m and a width of an n type region between the region 3 and the surrounding second region 4 is 20 $\mu$m. A p-electrode 6 is formed on the region 3 of the absorbing layer, and an anti-reflection film 5 is formed on the region 3 inside the electrode 6 and a device protection film 9 is formed on the semiconductive crystal layer 2 outside the electrode 6. In the present structure, like the first embodiment, the charges generated by the light directed to the outside of the photo-sensing region 10 are collected to the second region 4 so that the degradation of the response speed is prevented. FIG. 5C shows an alternative wherein regions 3 and 4 have the same depth.

Figure 7A:
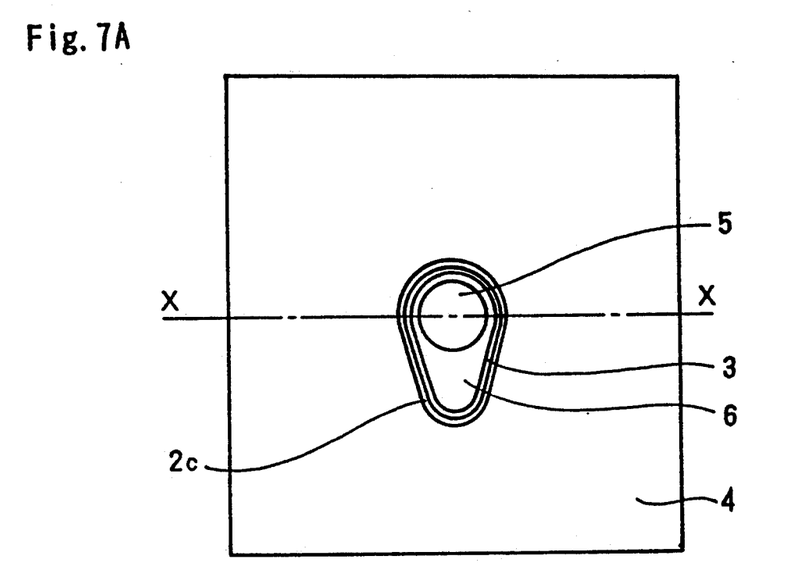
FIGS. 7A and 7B respectively show a structure of a photo-sensing device in accordance with a third embodiment of the present invention.
Figure 7B:
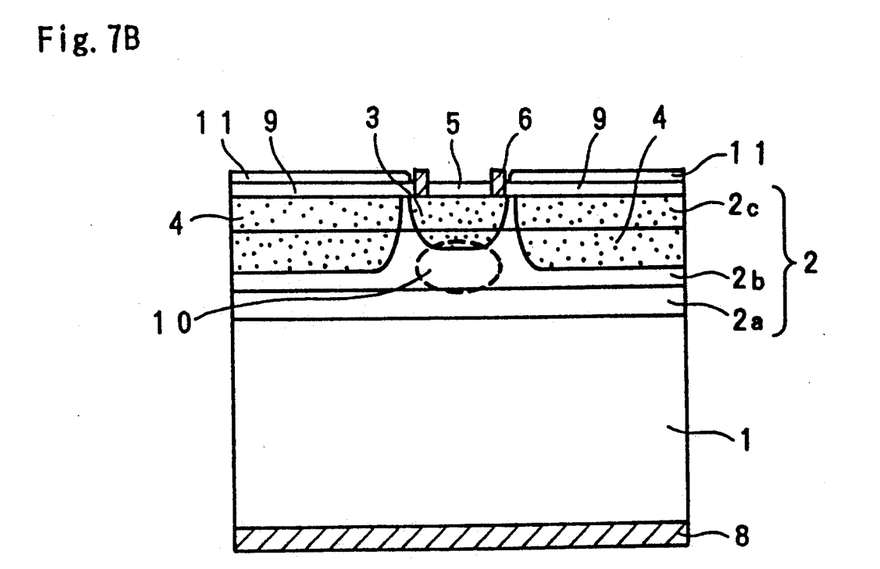

A third embodiment is now explained with reference to FIGS. 7A and 7B. FIG. 7A shows a top view and FIG. 7B shows an X—X sectional view. As shown, an n-type InP buffer layer 2a (n=$2\times 10^{15}$cm$^{-3}$, thickness 2 $\mu$m), an n-type $In_{0.53}Ga_{0.47}As$ absorbing layer 2b (n=$2\times 10^{15}$cm$^{-3}$, thickness 3.5 $\mu$m), and an n-type InP window layer 2c (n=$2\times 10^{16}$cm$^{-3}$, thickness 2 $\mu$m) are formed on a surface of an n$^+$-type InP semiconductor substrate 1(n=$2\times 10^{18}$cm$^{-3}$) having an n-electrode 8 formed on an underside thereof. Further, a first region 3 and a second region 4 of p-type are formed in the photo-sensing layer 2b and the window layer 2c by the selective diffusion of Zn(zinc) by the sealed ampoule method. A p-electrode is formed on the first region 3 in the semiconductor crystal layer 2, and an anti-reflection film 5 is formed on the region 3 inside the electrode 6 and a device protection film 9 is formed outside the electrode 6. A metal film 11 is formed on the device protection film 9 to surround the first region 3. A spacing between the metal film 11 and the p-electrode 6 is maintained at 5 $\mu$m.

Figure 7C:
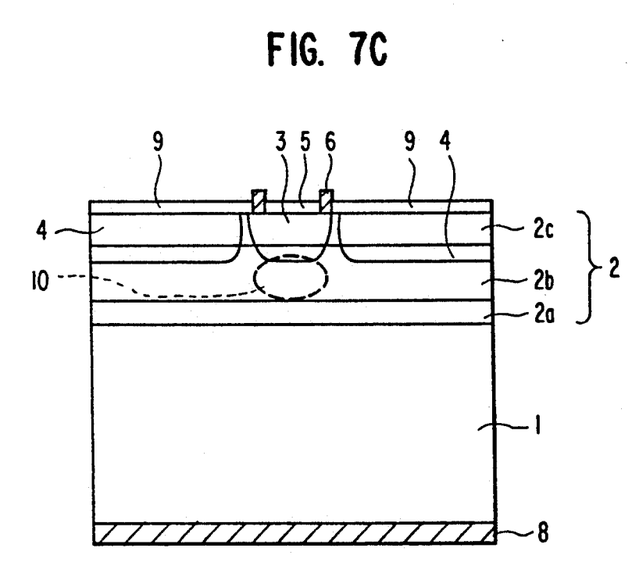
FIG. 7C shows an alternative form of the embodiment of FIGS. 7A and 7B.

It is preferable that the thickness of the photo-sensing layer 2b is between 1 $\mu$m and 7 $\mu$m in order to attain efficient absorption of the incident light, although it is not limited thereto. Further, it is preferable that a diameter of the first region 3 is 100 $\mu$m, and the width of the n type region between the first region 3 and the second region 4 is between 5 $\mu$m and 30 $\mu$m in order to attain a good response characteristic and electrical characteristic although it is not limited thereto. FIG. 7C shows an alternative wherein regions 3 and 4 have the same depth.

In the present structure, since the light directed to the outside of the photo-sensing region is reflected by the metal film 11, the generation of extra charges is prevented and the degradation of the response speed is effectively prevented.

The semiconductor materials and the dimensions thereof are examples and they change depending on applications and wavelengths. For example, the semiconductor materials may be compound semiconductors such as GaAs (gallium-arsenide), AlGaAs (aluminum-gallium-arsenide), CdTe (cadmium-telluride), HgCdTe (mercury-cadmium-telluride), InSb (indium-antimonide), or Si (silicon) or Ge (germanium). The impurity diffusion may be done by an ion implantation method.

In accordance with the present invention, the degradation of the response speed is prevented by the simple means of depleting a portion of the light absorption region around the photo-sensing region and collecting the charges generated by the light directed to a outside of the photo-sensing region, and the highly sensitive photo-sensing device is provided.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

I claim:

1. A photo-sensing device for receiving light on a top surface thereof, said device comprising:
   a compound semiconductor substrate;
   a cathode electrode provided on a main surface of said compound semiconductor substrate;
   a compound semiconductor layer of a first conductivity type provided on another main surface of said compound semiconductor substrate;
   a first region of a second conductivity type provided in said compound semiconductor layer, a pn junction area being formed by said compound semiconductor layer and said first region, said pn junction functioning as a photo-sensing region;
   a second region of said second conductivity type surrounding said first region and being spaced from said first region, said second region absorbing carriers generated near said second region in response to incident light; and
   an anode electrode provided on said first region and electrically connected thereto.

2. A photo-sensing device according to claim 1 wherein said compound semiconductor layer is made by crystal growth of a semiconductor material having a composition which is the same as that of said compound semiconductor substrate.

3. A photo-sensing device according to claim 17, wherein said compound semiconductor layer is a lamination of a plurality of semiconductor layers having lower impurity concentrations than that of said semiconductor substrate, and at least one of said plurality of semiconductive layers, which does not contact said compound semiconductor substrate has a composition which is different from said compound semiconductor substrate.

4. A photo-sensing device according to claim 3, wherein said compound semiconductor substrate is an n$^+$-type InP (indium-phosphoride) substrate, and said semiconductor layer is a lamination of an n-type InP buffer layer, an n-type InGaAs (indium-gallium-arsenide) absorbing layer and an n-type InP window layer, in sequence.

5. A photo-sensing device according to claim 2, wherein said second region has the same depth as that of said first region.

6. A photo-sensing device according to claim 3, wherein said second region has the same depth as that of said first region.

7. A photo-sensing device according to claim 2, wherein said second region is deeper than said first region.

8. A photo-sensing device according to claim 3, wherein said second region is deeper than said first region.

9. A photo-sensing device according to claim 7, wherein a charge take-out electrode is formed on said second region.

10. A photo-sensing device according to claim 5, wherein an upper surface of said semiconductor layer, exclusive of a portion of said upper surface above said first region, is covered with a metal film.

11. A photo-sensing device according to claim 6, wherein an upper surface of said semiconductor layer, exclusive of a portion of said upper surface above said first region, is covered with a metal film.

12. A photo-sensing device according to claim 8, wherein a charge take-out electrode is formed on said second region.

13. A photo-sensing device according to claim 5, wherein a charge take-out electrode is formed on said second region.

14. A photo-sensing device according to claim 6, wherein a charge take-out electrode is formed on said second region.

15. A photo-sensing device for receiving light on a top surface thereof, said device comprising:
- a compound semiconductor substrate of a highly doped first conductivity type;
- a low doped compound semiconductor layer provided on a front surface of said compound semiconductor substrate;
- a first region of a highly doped second conductivity type provided in said low doped semiconductor layer, a pn junction functioning as a photo-sensing region being formed by said first region and said low doped semiconductor layer;
- a second region of said second conductivity type surrounding said first region and being spaced from said first region; and
- a cathode electrode provided on a back surface of said compound semiconductor substrate.

* * * * *